(12) United States Patent
Ohashi

(10) Patent No.: US 11,131,984 B2
(45) Date of Patent: Sep. 28, 2021

(54) SUBSTRATE PRODUCTION CONTROL SYSTEM AND SUBSTRATE PRODUCTION CONTROL METHOD

(71) Applicant: FUJI CORPORATION, Chiryu (JP)

(72) Inventor: Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/468,984

(22) PCT Filed: Dec. 14, 2016

(86) PCT No.: PCT/JP2016/087166
§ 371 (c)(1),
(2) Date: Jun. 12, 2019

(87) PCT Pub. No.: WO2018/109856
PCT Pub. Date: Jun. 21, 2018

(65) Prior Publication Data
US 2019/0310610 A1    Oct. 10, 2019

(51) Int. Cl.
*G05B 19/418* (2006.01)
*G06Q 10/06* (2012.01)
*G06Q 50/04* (2012.01)

(52) U.S. Cl.
CPC ..... *G05B 19/418* (2013.01); *G05B 19/41865* (2013.01); *G06Q 10/06315* (2013.01);
(Continued)

(58) Field of Classification Search
CPC ........ G05B 19/418; G05B 2219/25419; G05B 2219/31429
(Continued)

(56) References Cited

U.S. PATENT DOCUMENTS 6,438,436 B1   8/2002  Hohkibara et al.
2004/0186765 A1*  9/2004  Kataoka ................. G06Q 10/06
                                                   705/7.29
(Continued)

FOREIGN PATENT DOCUMENTS

CN       104299107 A    1/2015
EP       2 819 496 A1   12/2014
(Continued)

OTHER PUBLICATIONS

Kingsman, "Modelling input-output workload control for dynamic capacity planning in production planning system", 2000, Int. J. Production Economics 68, p. 73-93. (Year: 2000).*

(Continued)

*Primary Examiner* — Hien D Khuu
(74) *Attorney, Agent, or Firm* — Oblon, McClelland, Maier & Neustadt, L.L.P.

(57) ABSTRACT

A substrate production control system includes production start timing obtaining section configured to obtain information of production start timing on substrate production lines, setup time estimation section configured to estimate setup times required for a setup work of setting up the substrate production line, setup start timing determination section configured to determine setup start timing of starting the setup work based on the production start timing and the setup time, delivery time estimation section configured to estimate delivery time required for a delivery work of receiving a member necessary for production of the substrate from member warehouse and conveying the member to at least one of an execution location (external setup area) of the setup work and the substrate production line, and delivery start timing determination section configured to determine delivery start timing of starting the delivery work based on the setup start timing and the delivery time.

17 Claims, 3 Drawing Sheets

(52) U.S. Cl.
CPC ... *G06Q 50/04* (2013.01); *G05B 2219/25419* (2013.01); *G05B 2219/31429* (2013.01); *G05B 2219/40066* (2013.01); *Y02P 90/02* (2015.11)

(58) Field of Classification Search
USPC .................................................. 700/121, 100
See application file for complete search history.

(56) References Cited

U.S. PATENT DOCUMENTS

2019/0302747 A1* 10/2019 Takehara ......... G05B 19/41865
2019/0303839 A1* 10/2019 Takehara ....... G06Q 10/063116

FOREIGN PATENT DOCUMENTS

| JP | 8-314526 A | 11/1996 |
| JP | 2012-182246 A | 9/2012 |

OTHER PUBLICATIONS

Trovinger et al., "Setup Time Reduction for Electronics Assembly", 2005, Production and Operations Management, vol. 14, No. 2, pp. 205-217. (Year: 2005).*
Günther, H-O. et al. "Workload planning in small lot printed circuit board assembly", OR Spektrum, XP55085604, 19: 1997, pp. 147-157.
International Search Report dated Mar. 21, 2017 in PCT/JP2016/087166 filed on Dec. 14, 2016.

\* cited by examiner

SUBSTRATE PRODUCTION CONTROL SYSTEM AND SUBSTRATE PRODUCTION CONTROL METHOD

TECHNICAL FIELD

The present application relates to a substrate production control system for controlling a schedule for producing a substrate on which an electronic component is mounted, and a substrate production control method for controlling the schedule.

BACKGROUND ART

Substrate production machines for producing a substrate, on which a large number of electronic components are mounted, include a solder printing machine, a component mounter, a reflow machine, a substrate inspection machine, and the like. In general, a substrate production line is configured by connecting these substrate production machines. In general, prior to a production start, a setup work of setting up a substrate production line is performed so as to produce a substrate. In many cases, prior to the setup work, a delivery work of unloading a necessary member from a member warehouse is necessary. Further, except for a case of a small number of substrates being produced, a replenishment work is performed to replenish a consumed member with progress of the production. Patent Literature 1 discloses a technical example related to an operation performed on a substrate production line.

A reel component supply method described in claim 3 of Patent Literature 1 discloses a step in which a production control means notifies a component control means in a reel warehouse of supply information on a component to be a shortage on the substrate production line. According to this step, based on the supply information of the component, a corresponding reel can be extracted from multiple reels on a reel shelf in order of use, and replenishment work efficiency is greatly improved.

PATENT LITERATURE

Patent Literature 1: JP-A-2012-182246

BRIEF SUMMARY

Technical Problem

Meanwhile, Patent Literature 1 is a technology related to a replenishment work after production of a substrate is started, and does not involve a delivery work or a setup work performed prior to the production start. Conventionally, a start timing of the delivery work and the setup work is determined based on a production schedule for determining a production start timing of the substrate. However, an actual operation state of the substrate production line or an actual progress state of the delivery work and the setup work is not shared between multiple control devices and multiple production managers related to the state. Therefore, this tends to cause inconsistency in the schedule for producing the substrate production.

For example, if the delivery work or the setup work related to a next substrate type to be produced next is delayed, the substrate production line is in a long standby state after production of the substrate of a current substrate type currently being produced is completed. In other words, productivity of the substrate production line is decreased.

On the other hand, if a production progress state of the current substrate type on the substrate production line is delayed, a member for the next substrate type for which the setup work is completed stay as an in-process inventory.

The present disclosure is made in view of the problem described above in the background art, and an object of the present disclosure is to provide a substrate production control system and a substrate production control method capable of optimizing start timings of a setup work and a delivery work prior to a production start of a substrate.

Solution to Problem

According to an aspect disclosed in the present description, there is provided a substrate production control system including: a production start timing obtaining section configured to obtain a production start timing information which is a scheduled timing when production of a substrate is started on a substrate production line; a setup time estimation section configured to estimate a setup time required for a setup work of setting up the substrate production line so as to produce the substrate; a setup start timing determination section configured to determine a setup start timing of starting the setup work based on the production start timing and the setup time; a delivery time estimation section configured to estimate a delivery time required for a delivery work of receiving a member necessary for production of the substrate from a member warehouse and conveying the member to at least one of an execution location for the setup work and the substrate production line; and a delivery start timing determination section configured to determine a delivery start timing of starting the delivery work based on the setup start timing and the delivery time.

According to another aspect disclosed in the present description, there is provided a substrate production control method including: obtaining a production start timing information which is a scheduled timing when production of a substrate is started on a substrate production line; estimating a setup time required for a setup work of setting up the substrate production line so as to produce the substrate; determining a setup start timing of starting the setup work based on the production start timing and the setup time; estimating a delivery time required for a delivery work of receiving a member necessary for production of the substrate from a member warehouse and conveying the member to at least one of an execution location of the setup work and the substrate production line; and determining a delivery start timing of starting the delivery work based on the setup start timing and the delivery time.

Advantageous Effects

With the substrate production control system disclosed in the present description, it is possible to determine an appropriate setup start timing by obtaining the production start timing information of the substrate and estimating the setup time required for the setup work. Further, by estimating the delivery time required for the delivery work, it is possible to determine an appropriate delivery start timing. Therefore, it is possible to optimize start timings of the setup work and the delivery work prior to the production start of the substrate.

Further, also in the substrate production control method disclosed in the present description, by obtaining the production start timing information of the substrate and estimating the setup time required for the setup work, it is possible to determine an appropriate setup start timing.

Further, by estimating the delivery time required for the delivery work, it is possible to determine an appropriate delivery start timing. Therefore, it is possible to optimize the start timings of the setup work and the delivery work prior to the production start of the substrate.

DESCRIPTION OF EMBODIMENTS

1. Configuration of Substrate Production Control System 1 of Embodiment

Figure 1:
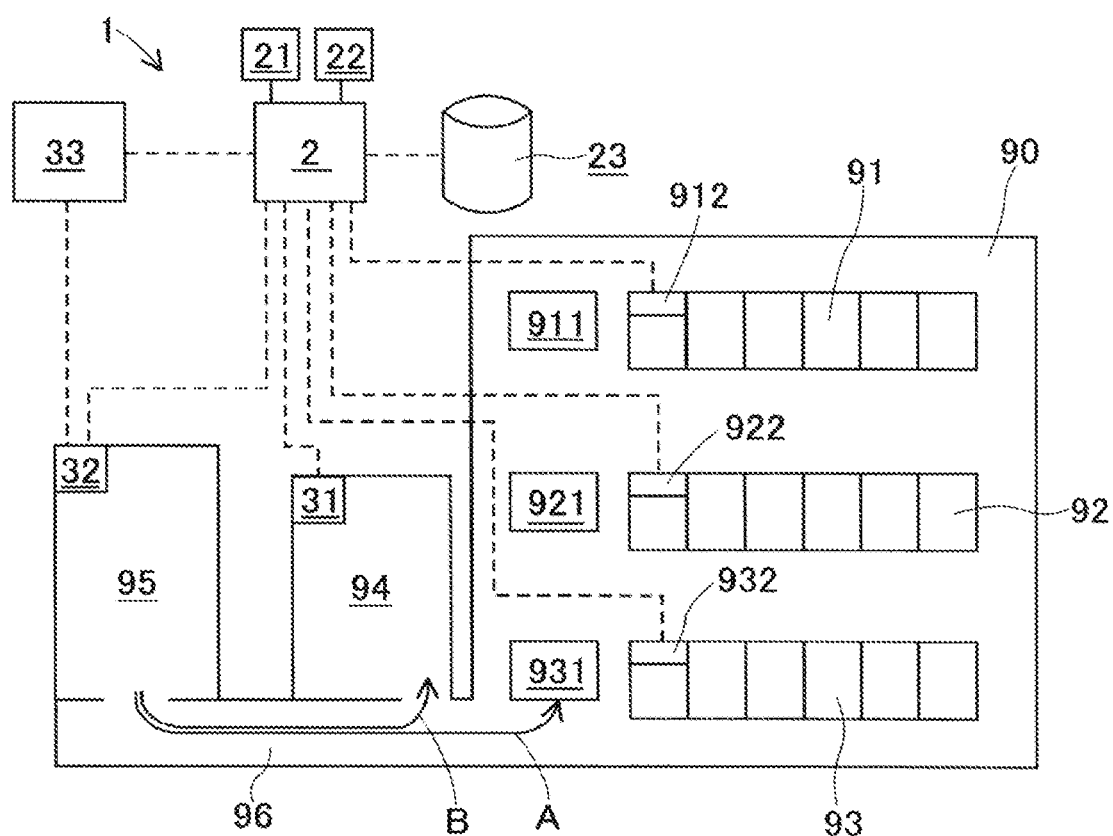
FIG. 1 is a diagram schematically illustrating a configuration of a substrate production control system and a configuration of a related section according to an embodiment.

Substrate production control system 1 of an embodiment will be described with reference to FIGS. 1 to 6. FIG. 1 is a diagram schematically illustrating a configuration of substrate production control system 1 and a configuration of a related section according to the embodiment. Substrate production control system 1 includes schedule control section 2, and is provided at a substrate production base. The substrate production base includes production area 90, external setup area 94, member warehouse 95, and passage 96.

In production area 90, first substrate production line 91, second substrate production line 92, and third substrate production line 93 are disposed. First substrate production line 91 is configured by arranging multiple substrate production machines in a row. First substrate production line 91 includes member supply shelf 911 and progress control section 912. On member supply shelf 911, a member used for production of a substrate is temporarily placed. An apparatus used by being exchanged in a substrate production machine, for example, a print screen of a solder printer or a suction nozzle of a component mounter may be temporarily placed on member supply shelf 911. Progress control section 912 detects a progress state of the substrate production, and transmits information on the progress state to schedule control section 2.

In the same manner, second substrate production line 92 is configured by arranging multiple substrate production machines in a row. Second substrate production line 92 includes member supply shelf 921 on which a member is temporarily placed, and progress control section 922 which detects a progress state of substrate production and transmits the detected progress state to schedule control section 2. Third substrate production line 93 is configured by arranging multiple substrate production machines in a row. Third substrate production line 93 includes member supply shelf 931 on which a member is temporarily placed, and progress control section 932 which detects a progress state of substrate production and transmits the detected progress state to schedule control section 2.

Here, a setup work prior to a production start of a substrate will be described. The setup work is performed when a type of the substrate to be produced in substrate production lines (91, 92, and 93) is switched, in other words, when a current substrate type is switched to a next substrate type. In the setup work, substrate production lines (91, 92, and 93) are set up so that the next substrate type can be produced. The setup work includes an internal setup work and an external setup work. The internal setup work is performed in substrate production lines (91, 92, and 93). The external setup work is performed at an execution location different from substrate production lines (91, 92, and 93).

There are two main methods for proceeding with the setup work. In a first setup method, only an internal setup work is executed. That is, after production of a current substrate type is completed in substrate production lines (91, 92, and 93), a production operation is stopped and an internal setup work of a next substrate type is executed. In a second setup method, an external setup work and an internal setup work are used together. That is, when the current substrate type is produced in substrate production lines (91, 92, and 93), the external setup work of the next substrate type is executed in parallel. When production of the current substrate type is completed, the process shifts from the external setup work to the internal setup work. As the external setup work executed in the second setup method, an external setup work of a component supply device of a component mounter can be exemplified, and the present configuration is not limited thereto.

More specifically, the component supply device includes a feeder type component supply device or a tray type component supply device. The feeder type component supply device is configured by arranging multiple feeders in a row on a pallet table. Each of the feeders exchangeably holds each of component reels. A carrier tape holding multiple electronic components is wound around the component reel. An operation of loading a component reel into the feeder and an operation of mounting the feeder on a pallet table can be executed in an external setup work. Further, the tray-type component supply device is configured by placing a tray on the pallet table. Multiple electronic components are arranged in a lattice shape on an inner side of an upper face of the tray. An operation of placing the tray on the pallet table can be executed in the external setup work.

On the other hand, an operation of installing the component supply device on a main body of the component mounter is an internal setup work. According to the second setup method, a lot of the setup work can be performed in advance in the external setup work. Therefore, a time required for the internal setup work in the second setup method is shorter than a time required for the internal setup work in the first setup method. That is, as compared with the first setup method, in the second setup method, a production stop time of substrate production lines (91, 92, and 93) is shortened and productivity is high.

Further, there is also a method of a setup work in which the component supply device is not detached from the main body of the component mounter. For example, a feeder having an exchanged component reel can be prepared in advance in the external setup work, and the prepared feeder can be mounted on the pallet table of the component supply device in the internal setup work. This method is effective in a case where the number of types of newly used electronic components is small. There are other variations in the method of proceeding the setup work. A timing when the setup work is started is called a setup start timing.

External setup area 94 is an execution location at which the external setup work described above is performed. External setup area 94 is adjacent to production area 90, and is common to three substrate production lines (91, 92, and 93). Progress detecting section 31 which detects a progress state of the external setup work is provided in external setup area 94. The pallet table of the component supply device described above has a communication function and is communicatively connected to progress detecting section 31. The pallet table recognizes a feeder mounted by an operator and a tray placed by the operator. The pallet table further transmits information on the mounted feeder and the placed tray to progress detecting section 31.

Further, a code recognition section which recognizes an identification code attached to a feeder, a component reel, and a tray is also communicatively connected to progress detecting section 31. The identification code identifies the individual feeder, component reel, and tray. For example, a bar code is used as the identification code, and for example, a bar code reader is used as the code recognition section. The code recognition section transmits information on the recognized identification code to progress detecting section 31.

Progress detecting section 31 detects the progress state of the external setup work, based on the information received from the pallet table and the code recognition section. For example, in a case where 40 feeders are mounted on the pallet table in the external setup work, if 10 feeders are already mounted, progress detecting section 31 can detect that 25% of the external setup work is progressed. Progress detecting section 31 transmits the information on the progress state of the external setup work to schedule control section 2.

Further, progress control sections (912, 922, and 932) of substrate production lines (91, 92, and 93) has the same function as progress detecting section 31, and detects a progress state of the internal setup work. Progress control sections (912, 922, and 932) transmit information on the progress state of the internal setup work to schedule control section 2.

Member warehouse 95 is provided slightly away from external setup area 94. Member warehouse 95, external setup area 94, and production area 90 are connected so as to travel through passage 96. Member warehouse 95 stores a member necessary for a substrate to be produced in substrate production lines (91, 92, and 93). Examples of necessary members include solder, a bonding wire, an adhesive, and the like in addition to a substrate raw material or an electronic component.

Inventory detecting section 32 which measures an inventory amount of stored members is provided in member warehouse 95. In response to an inquiry of schedule control section 2 designating a member, inventory detecting section 32 responds to an inventory amount of the designated member. Further, inventory detecting section 32 is linked to member procurement system 33. Member procurement system 33 has an automatic procurement function of compensating for a decrease in the inventory amount measured by inventory detecting section 32, and a manual procurement function according to a command operation of an operator.

Here, the delivery work prior to the setup work will be described. The delivery work is an operation of receiving a member necessary for production of a substrate from member warehouse 95 and conveying the member to at least one of external setup area 94 and substrate production lines (91, 92, and 93). As indicated by arrow A in FIG. 1, an operator conveys a member necessary for the internal setup work from member warehouse 95 to member supply shelves (911, 921, and 931) of substrate production lines (91, 92, and 93) or a vicinity of the substrate production machine. As indicated by arrow B, the operator conveys a member necessary for the external setup work from member warehouse 95 to external setup area 94.

Except for a case where the number of substrates to be produced is small, a member for replenishment, which is not necessary for the immediate setup work but is necessary with progress of substrate production, is generated. The delivery work is divided into two types according to a delivery timing of the member for replenishment. A first type is a batch delivery work, in which the operator collectively receives members necessary for a predetermined number of substrates to be produced from member warehouse 95. A second type is a division delivery work, in which the operator divides and receives members necessary for the setup work and members necessary with progress of substrate production from member warehouse 95. A timing at which the delivery work is started is called a delivery start timing.

2. Functional Configuration of Schedule Control Section 2

A functional configuration of schedule control section 2 will be described. Schedule control section 2 plays a main role of substrate production control system 1. Schedule control section 2 is configured by using a computer device having a CPU and operating by software. Schedule control section 2 includes display section 21 and input section 22. Schedule control section 2 can access to production database 23. A production manager sets a production order of multiple types of substrates to be produced on substrate production lines (91, 92, and 93), and a schedule of a production start timing of each of substrate types, in production database 23. Production database 23 also stores multiple pieces of recipe data describing in detail a production operation and the like when producing substrates having various substrate types on substrate production lines (91, 92, and 93).

By referring to the recipe data generated for each of substrate types, schedule control section 2 can obtain information of a member necessary for the substrate type. Schedule control section 2 can obtain information of the member necessary for the delivery work and can obtain a work content information of the setup work by referring to and comparing pieces of the recipe data corresponding to the next substrate type to be produced and the previous substrate type produced before that. That is, a member which is not used for the previous substrate type and is used for the next substrate type needs the delivery work. Further, the setup work is required for the delivered member.

Further, schedule control section 2 can instruct member procurement system 33 to procure a member as necessary. Member procurement system 33 has an automatic procurement function of procuring the member in response to a command from schedule control section 2.

Figure 2:
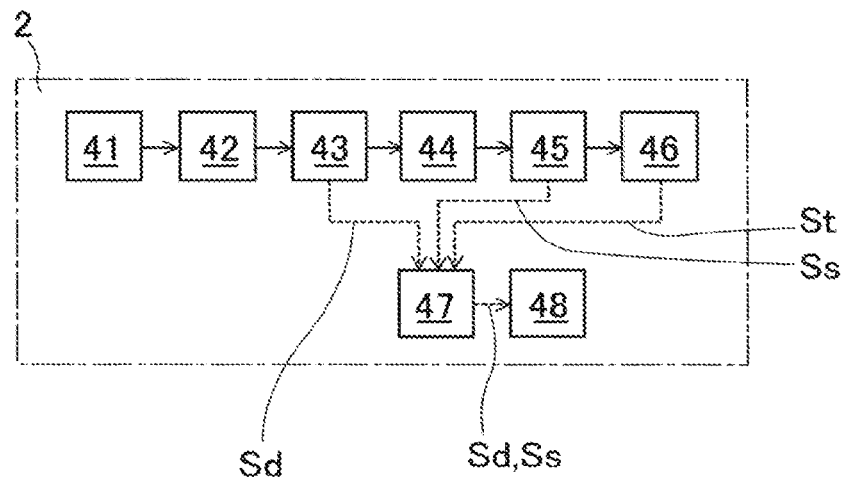
FIG. 2 is a function block diagram illustrating a functional configuration of a schedule control section.

FIG. 2 is a function block diagram illustrating a functional configuration of schedule control section 2. Schedule control section 2 includes production start timing obtaining section 41, setup time estimation section 42, setup start timing determination section 43, delivery time estimation section 44, delivery start timing determination section 45, inventory control section 46, progress state control section 47, and start timing guide section 48, as a control function section.

Production start timing obtaining section 41 operates at a scheduled timing when production of a certain substrate type is started on certain substrate production lines (91, 92, and 93), that is, when a production start timing is set in production database 23. Production start timing obtaining section 41 also operates when the set production start timing is modified. After the operation of production start timing obtaining section 41, setup time estimation section 42, setup start timing determination section 43, delivery time estimation section 44, and delivery start timing determination section 45 operate in order. Production start timing obtaining section 41, setup time estimation section 42, setup start timing determination section 43, delivery time estimation section 44, and delivery start timing determination section 45 perform a substrate production control method according to the embodiment.

Inventory control section 46 investigates an inventory amount in the member warehouse at an inventory check timing set by inventory control section 46. Progress state control section 47 detects a progress state of at least one of the delivery work and the setup work, and performs predetermined control based on the progress state. Further, start timing guide section 48 guides that at least one of the delivery start timing and the setup start timing arrives. A detailed function of each of control function sections of schedule control section 2 will be described in detail in the description of an operation of substrate production control system 1.

3. Operation of Substrate Production Control System 1 of Embodiment

Figure 3:
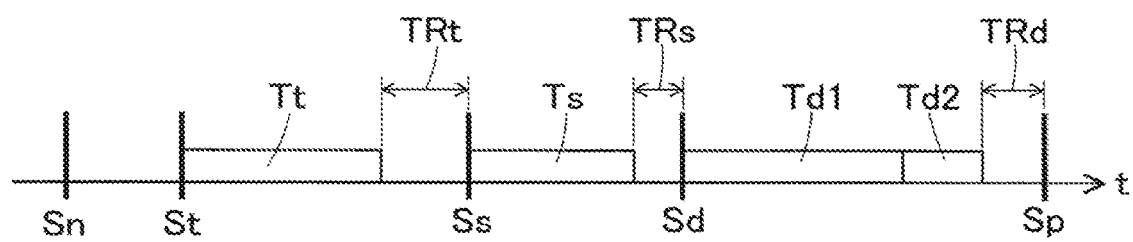
FIG. 3 is a diagram for explaining an operation in which the substrate production control system determines a setup start timing and a delivery start timing.

Next, the operation of substrate production control system 1 according to the embodiment will be described. FIG. 3 is a diagram for explaining an operation in which substrate production control system 1 determines setup start timing Sd and delivery start timing Ss. FIG. 3 illustrates current timing Sn, and time t elapses toward the right side. Production start timing obtaining section 41 obtains, from production database 23, production start timing information Sp which is a scheduled timing of starting production of a certain substrate type on substrate production lines (91, 92, and 93).

Following production start timing obtaining section 41, setup time estimation section 42 operates. Setup time estimation section 42 estimates a setup time required for a setup work corresponding to the certain substrate type. In the present embodiment, the second setup method and the division delivery work are adopted. Therefore, the setup time is a sum total of external setup time Td1 required for an external setup work and internal setup time Td2 required for an internal setup work. In the delivery work, only a member necessary for the external setup work among members necessary for production of a substrate is delivered. Setup time estimation section 42 can estimate external setup time Td1 based on types and a quantity of members required for the external setup work.

When describing an example of an estimation method, a standard loading time is set to an operation of loading a component reel into a feeder. Further, a standard detaching time is set to an operation of detaching an unnecessary feeder from a pallet table, and a standard mounting time is set to an operation of mounting a feeder to be newly used on the pallet table. The standard loading time, the standard detaching time, and the standard mounting time are set with high accuracy based on past work performance.

Setup time estimation section 42 can estimate a total loading time by multiplying the number of reels of component reels to be loaded by the standard loading time. Further, setup time estimation section 42 can estimate a total detaching time by multiplying the number of feeders to be detached by the standard detaching time, and can estimate a total mounting time by multiplying the number of feeders to be mounted by the standard mounting time. Setup time estimation section 42 adds the total loading time, the total detaching time, and the total mounting time to obtain external setup time Td1.

Further, setup time estimation section 42 can estimate internal setup time Td2 based on a work content of the internal setup work. For example, a standard attachment/detachment time is set to an operation of detaching an unnecessary component supply device and installing a component supply device to be newly used. Setup time estimation section 42 can estimate the total attachment/detachment time by multiplying the number of component supply devices to be attached/detached in the internal setup work by the standard attachment/detachment time. Even in a case of attaching and detaching a feeder instead of attaching and detaching the component supply device, setup time estimation section 42 can estimate the total attachment/detachment time in the same method.

Internal setup time Td2 includes a conveyance time for conveying the component supply device or the feeder set up in external setup area 94 to substrate production lines (91, 92, and 93). Further, internal setup time Td2 includes a check time for checking that the setup work is appropriately completed. The standard attachment/detachment time, the conveyance time, and the check time are also set with high accuracy based on past work performance. Setup time estimation section 42 adds the conveyance time, the total attachment/detachment time, and the check time to obtain internal setup time Td2. When the setup work is performed by multiple operators, setup time estimation section 42 estimates external setup time Td1 and internal setup time Td2 by considering the number of operators.

Following setup time estimation section 42, setup start timing determination section 43 operates. Setup start timing determination section 43 determines setup start timing Sd based on production start timing Sp, external setup time Td1, and internal setup time Td2. Further, setup start timing determination section 43 transfers information of setup start timing Sd to progress state control section 47.

When determining setup start timing Sd, setup start timing determination section 43 considers setup risk margin time TRd corresponding to a risk that the setup work is prolonged. Setup risk margin time TRd is set in consideration of variations in a work ability of the operator, an inhibition situation which may unexpectedly occur, and the like. Setup start timing determination section 43 adds external setup time Td1, internal setup time Td2, and setup risk margin time TRd to obtain an estimated setup time. Further, setup start timing determination section 43 sets a timing earlier than production start timing Sp by the estimated setup time as setup start timing Sd. Further, setup start timing determination section 43 considers an operation time when the operator can perform the setup work.

For example, it is assumed that the operation time of the operator is determined to be 8:00 to 12:00 and 13:00 to 17:00 on weekdays, production start timing Sp is 13:00 on Wednesday of December 7, and the estimated setup time is 6 hours. In this case, setup start timing determination section 43 assigns the estimated setup time within the operation time of the operator, and determines that setup start timing Sd is 15:00 on December 6. Further, for example, in a case where multiple operators can operate through 24 hours in a work shift system, setup start timing determination section 43 does not need to consider the operation time of the operators.

Following setup start timing determination section 43, delivery time estimation section 44 operates. Delivery time estimation section 44 estimates delivery time Ts required for the delivery work of receiving a member required for the external setup work from member warehouse 95 and conveying the member to external setup area 94. Based on the type and the quantity of the member, delivery time estimation section 44 can estimate a time required to wait for unloading the member from member warehouse 95, the number of times and a time required to load and unload the member onto and from a carrier for conveyance, the number of times and a time required to reciprocate the carrier between member warehouse 95 and external setup area 94, and the like. Delivery time estimation section 44 adds these required times to obtain delivery time Ts. In a case where the delivery work is performed by multiple operators, delivery time estimation section 44 estimates delivery time Ts in consideration of the number of operators.

Following delivery time estimation section 44, delivery start timing determination section 45 operates. Delivery start timing determination section 45 determines delivery start timing Ss based on setup start timing Sd and delivery time Ts. Further, delivery start timing determination section 45 transfers information of delivery start timing Ss to progress state control section 47.

When determining delivery start timing Ss, delivery start timing determination section 45 considers delivery risk margin time TRs corresponding to a risk that the delivery work is prolonged. Delivery risk margin time TRs is set in consideration of variations in a work ability of the operator, an inhibition situation which may unexpectedly occur, and the like. Delivery start timing determination section 45 adds delivery time Ts and delivery risk margin time TRs to obtain an estimated delivery time. Further, delivery start timing determination section 45 sets a timing earlier than setup start timing Sd by the estimated delivery time as delivery start timing Ss. Further, in the same manner as setup start timing determination section 43, delivery start timing determination section 45 considers the operation time when the operator can perform the delivery work.

Following delivery start timing determination section 45, inventory control section 46 operates. Inventory control section 46 sets inventory check timing St earlier than delivery start timing Ss. Further, inventory control section 46 transfers information of inventory check timing St to progress state control section 47. When setting inventory check timing St, inventory control section 46 considers standard procurement time Tt of the member and procurement risk margin time TRt corresponding to a risk that procurement time Tt is prolonged. Procurement risk margin time TRt is set in consideration of variations in procurement time Tt, an inhibition situation which may unexpectedly occur, and the like. Inventory control section 46 adds procurement time Tt and procurement risk margin time TRt to obtain an estimated procurement time. Further, inventory control section 46 sets a timing earlier than delivery start timing Ss by the estimated procurement time as inventory check timing St. Thereafter, inventory control section 46 stops to inventory check timing St arrives.

When inventory check timing St arrives, in other words, when current timing Sn coincides with inventory check timing St, inventory control section 46 investigates the inventory amount in member warehouse 95. More specifically, inventory control section 46 designates a member necessary for the external setup work, and inquires an inventory amount of the member of inventory detecting section 32 of member warehouse 95. Inventory control section 46 does nothing in a case where the inventory amount of the member is satisfied. However, in a case where the inventory amount of any member is insufficient, inventory control section 46 instructs member procurement system 33 to procure the member.

Figure 4:
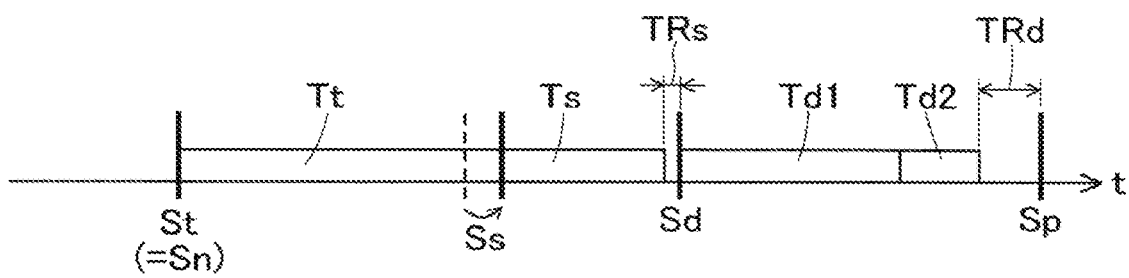
FIG. 4 is a diagram for explaining a schedule modification function of an inventory control section.

According to the procurement instruction, in general, the insufficient member is procured to delivery start timing Ss and is stored into member warehouse 95. However, there is no possibility that procurement time Tt is prolonged than expected. In this case, inventory control section 46 performs a modification function of the schedule. FIG. 4 is a diagram for explaining the schedule modification function of inventory control section 46. In FIG. 4, current timing Sn coincides with inventory check timing St, and inventory control section 46 instructs procurement of the insufficient member. As a result, in member procurement system 33, it is found that procurement time Tt is prolonged than procurement risk margin time TRt. In other words, it is found that a warehousing timing of the procured member to member warehouse 95 is not in time for delivery start timing Ss.

At this time, inventory control section 46 performs modification to delay at least one of delivery start timing Ss, setup start timing Sd, and production start timing Sp. In the example in FIG. 4, inventory control section 46 delays delivery start timing Ss. Accordingly, a generation time slot of delivery time Ts is delayed. As a result, delivery risk margin time TRs decreases but does not become zero. Therefore, inventory control section 46 does not need to modify setup start timing Sd and production start timing Sp. If procurement time Tt is further prolonged largely, inventory control section 46 modifies setup start timing Sd and production start timing Sp as necessary.

Progress state control section 47 receives information of setup start timing Sd, delivery start timing Ss, and inventory check timing St, starts an operation, and thereafter continues the operation. Progress state control section 47 displays setup start timing Sd, delivery start timing Ss, and inventory check timing St on display section 21 to notify the production manager or the operator. Further, progress state control section 47 transfers information on setup start timing Sd and delivery start timing Ss to start timing guide section 48. Further, when setup start timing Sd and production start timing Sp are modified as described below, progress state control section 47 sequentially transfers the modified information to start timing guide section 48.

Progress state control section 47 detects the progress state of at least one of the delivery work and the setup work. More specifically, progress state control section 47 designates a member necessary for the external setup work, and inquires a delivery amount of the member of inventory detecting section 32 of member warehouse 95. Accordingly, progress state control section 47 can obtain a delivery state information of the member and detect the progress state of the delivery work. For example, if half of members required for the external setup work are already delivered, progress state control section 47 can detect the progress state of the delivery work as 50%.

Progress state control section 47 can also receive information on the progress state of the external setup work, from progress detecting section 31 of external setup area 94. Further, progress state control section 47 can receive information on the progress state of the internal setup work from progress control sections (912, 922, and 932) of substrate production lines (91, 92, and 93). Therefore, progress state control section 47 can detect the progress states of the external setup work and the internal setup work.

Further, based on the progress state, progress state control section 47 predicts at least one of an end timing of the delivery work and an end timing of the setup work, and notifies the production manager and the operator of a prediction result. As a notification method, a method of displaying the prediction result on display section 21 is used. Without being limited this, progress state control section 47 may notify the prediction result to a portable terminal owned by the production manager and the operator.

Figure 5:
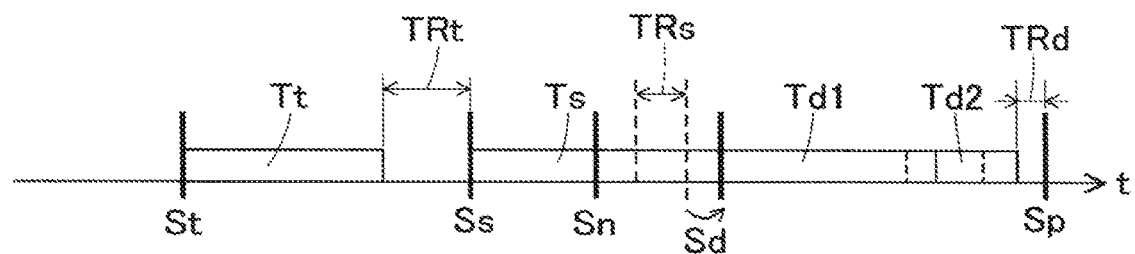
FIG. 5 is a diagram for explaining a schedule modification function of a progress state control section.

When an error occurs in the progress state, progress state control section 47 performs a modification function of a schedule or a modification function of a work execution plan. FIG. 5 is a diagram for explaining a schedule modification function of progress state control section 47. In FIG. 5, current timing Sn is a timing when 75% of delivery time Ts is elapsed from delivery start timing Ss. At this point, progress state control section 47 detects the progress state of 50% of the delivery work, and obtains an error information of the progress state. Progress state control section 47 modifies a start timing of at least one of setup start timing Sd and production start timing Sp, based on the prediction result.

In the example in FIG. 5, progress state control section 47 predicts that delivery time Ts is largely prolonged than the initial estimation, and the end timing of the delivery work is later than initial setup start timing Sd. Therefore, progress state control section 47 performs modification to delay setup start timing Sd. Accordingly, generation time slots of external setup time Td1 and internal setup time Td2 are delayed. As a result, setup risk margin time TRd decreases but does not become zero. Therefore, progress state control section 47 does not need to modify production start timing Sp. If delivery time Ts is further prolonged largely, inventory control section 46 modifies production start timing Sp as necessary.

Figure 6:
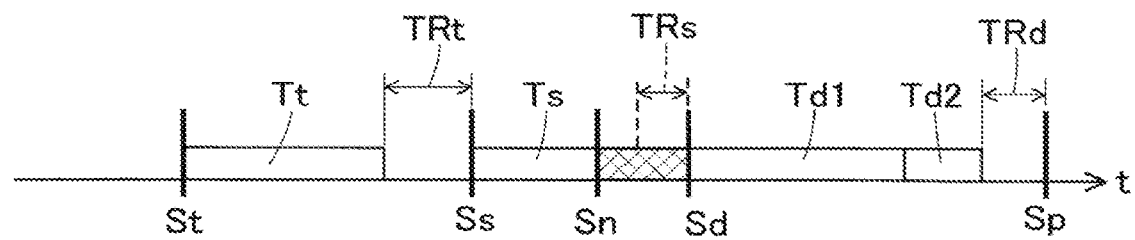
FIG. 6 is a diagram for explaining a modification function of a work execution plan in the progress state control section.

FIG. 6 is a diagram for explaining a modification function of a work execution plan of progress state control section 47. In FIG. 5, current timing Sn is a timing when 75% of delivery time Ts is elapsed from delivery start timing Ss. At this point, progress state control section 47 detects the progress state of 50% of the delivery work, and obtains an error information of the progress state. Progress state control section 47 modifies at least one of a work execution plan of the delivery work and a work execution plan of the setup work, based on the prediction result.

In the example in FIG. 6, progress state control section 47 predicts that delivery time Ts is largely prolonged than the initial estimation, and the end timing of the delivery work is later than initial setup start timing Sd. Therefore, progress state control section 47 modifies the work execution plan of the delivery work. For example, progress state control section 47 modifies the work execution plan (a time slot indicated by hatching in FIG. 6) from current timing Sn to setup start timing Sd so that the delivery work is accurately completed at setup start timing Sd.

More specifically, the current operator is replaced by a skilled operator with a high work ability, the number of operators is increased, and the operation time is extended (so-called overtime work). Accordingly, progress state control section 47 does not need to modify the schedule subsequent to setup start timing Sd. When setup start timing Sd is delayed even if the work execution plan of the delivery work is modified, progress state control section 47 can modify the work execution plan of the setup work so as to maintain production start timing Sp.

Based on the latest information received from progress state control section 47, start timing guide section 48 guides that at least one of delivery start timing Ss and setup start timing Sd arrives, to the production manager and the operator. As a guidance method, a method of displaying delivery start timing Ss and setup start timing Sd on display section 21 is used. Without being limited to this, start timing guide section 48 may guide that at least one of delivery start timing Ss and setup start timing Sd arrives, to a portable terminal owned by the production manager and the operator. According to this, the operator can start the delivery work and the setup work in a timely manner based on the guidance. Therefore, a delay in starting the work is suppressed.

As described above, delivery start timing Ss and setup start timing Sd are appropriately determined based on production start timing Sp, external setup time Td1, internal setup time Td2, and delivery time Ts. Further, when production start timing Sp is changed in accordance with a change in an operation state of substrate production lines (91, 92, and 93), substrate production control system 1 operates again, and delivery start timing Ss and setup start timing Sd are automatically determined again. On the other hand, in a case where any of procurement time Tt, delivery time Ts, external setup time Td1, and internal setup time Td2 is prolonged, delivery start timing Ss, setup start timing Sd, and production start timing Sp are modified as necessary.

Therefore, an actual operation state of substrate production lines (91, 92, and 93) and actual progress states of the delivery work and the setup work are controlled in association with each other. Further, this control state is shared with the production manager and the operator. As a result, inconsistency does not occur in the schedule for producing the substrate.

Further, subsequent to production start timing Sp, a member replenishment timing is set to the member for replenishment which becomes necessary with progress of substrate production. Substrate production control system 1 can determine the delivery start timing and the setup start timing of the member for replenishment by replacing the member replenishment timing with production start timing Sp, in the same manner as in the case of the member necessary for the external setup work. However, since the member for replenishment is conveyed from member warehouse 95 to substrate production lines 91, 92, and 93, external setup time Td1 is unnecessary.

Further, even in a case where only the internal setup work is executed by adopting the first setup method, substrate production control system 1 can determine the delivery start timing and the setup start timing in the same manner. Also in this case, external setup Td1 is unnecessary.

Further, the modification function of the schedule of inventory control section 46, the modification function of the schedule of progress state control section 47, and the modification function of the work execution plan can be replaced with a modification suggestion function. That is, inventory control section 46 and progress state control section 47 cannot automatically execute the modification, and for example, a modification item can be displayed on display section 21 so as to prompt the production manager to perform the modification. When the production manager operates input section 22 to approve the modification item, inventory control section 46 and progress state control section 47 can execute the modification.

4. Aspect and Effect of Substrate Production Control System 1 of Embodiment

Substrate production control system 1 according to the embodiment includes production start timing obtaining section 41 which obtains production start timing information Sp which is a scheduled timing when production of a substrate is started on substrate production lines (91, 92, and 93), setup time estimation section 42 which estimates a setup time (external setup time Td1 and internal setup time Td2) required for a setup work of setting up substrate production lines (91, 92, and 93) so that the substrate can be produced, setup start timing determination section 43 which determines setup start timing Sd for starting the setup work based on production start timing Sp and the setup time, delivery time estimation section 44 which estimates delivery time Ts required for a delivery work of receiving a member necessary for the production of the substrate from member warehouse 95 and conveying the member to at least one of an execution location of the setup work (external setup area 94) and substrate production lines (91, 92, and 93), and delivery start timing determination section 45 which determines delivery start timing Ss for starting the delivery work based on setup start timing Sd and delivery time Ts.

According to this, it is possible to determine appropriate setup start timing Sd by obtaining production start timing information Sp of the substrate and estimating the setup time (external setup time Td1 and internal setup time Td2) required for the setup work. Further, by estimating delivery time Ts required for the delivery work, it is possible to determine appropriate delivery start timing Ss. Therefore, it is possible to optimize the start timings of the setup work and the delivery work prior to the production start of the substrate. As a result, a decrease in productivity of the substrate production line caused by the inconsistency of the schedule is suppressed, and an increase in an in-process inventory after the setup work is completed is suppressed.

Further, the setup work includes the external setup work having an execution location which is external setup area 94, and the internal setup work, executed after the external setup work, having an execution location which is substrate production lines (91, 92, and 93). According to this, it is possible to optimize the start timings of the setup work and the delivery work by the second setup method with high productivity using the external setup work and the internal setup work together.

Further, the delivery work is a batch delivery work in which members necessary for a predetermined number of substrates to be produced are collectively received from member warehouse 95, or a division delivery work in which members necessary for the setup work and members necessary with progress of substrate production are divided and received from member warehouse 95. According to this, it is possible to optimize the start timings of the setup work and the delivery work in both of the batch delivery work and the division delivery work.

Further, at least one of delivery start timing determination section 45 and setup start timing determination section 43 considers a risk margin time (delivery risk margin time TRs and setup risk margin time TRd) corresponding to a risk that the work is prolonged. According to this, a margin corresponding to variations in a work ability of the operator, an inhibition situation which may unexpectedly occur, and the like is secured.

Further, substrate production control system 1 of the embodiment further includes inventory control section 46 which investigates the inventory amount in member warehouse 95 at inventory check timing St earlier than delivery start timing Ss, and instructs procurement of a member in a case where the member is insufficient. According to this, the insufficient member is procured to delivery start timing Ss, and is stored into member warehouse 95. Therefore, an error that the member is insufficient at delivery start timing Ss does not occur.

Further, in a case where the warehousing timing of the procured member into member warehouse 95 is not in time for delivery start timing Ss, inventory control section 46 modifies at least one start timing of delivery start timing Ss, setup start timing Sd, and production start timing Sp, or prompts the production manager to modify the at least one start timing. According to this, the modification function of the schedule works, and the subsequent schedule is optimized.

Further, substrate production control system 1 of the embodiment further includes progress state control section 47 which detects the progress state of at least one of the delivery work and the setup work, predicts at least one of the end timing of the delivery work and the end timing of the setup work based on the progress state, and notifies the production manager of the prediction result. According to this, the production manager can accurately obtain the latest schedule information without delay.

Further, based on the prediction result, progress state control section 47 modifies the start timing of at least one of setup start timing Sd and production start timing Sp or prompts the production manager to modify the start timing of at least one of setup start timing Sd and production start timing Sp. According to this, the modification function of the schedule works, and the subsequent schedule is optimized.

Further, based on the prediction result, progress state control section 47 modifies at least one of the work execution plan of the delivery work and the work execution plan of the setup work or prompts the production manager to modify the at least one plan. According to this, the modification function of the work execution plan works, and the subsequent schedule is optimized.

Further, substrate production control system 1 of the embodiment further includes start timing guide section 48 which guides that at least one of the delivery start timing and the setup start timing arrives. According to this, since the operator can start the work in a timely manner based on the guidance, a delay in starting the work is suppressed.

Further, the substrate production control method according to the embodiment includes obtaining production start timing information Sp which is a scheduled timing when production of a substrate is started on substrate production lines (91, 92, and 93), estimating a setup time (external setup time Td1 and internal setup time Td2) required for a setup work of setting up substrate production lines (91, 92, and 93) so that the substrate can be produced, determining setup start timing Sd for starting the setup work based on production start timing Sp and the setup time, estimating delivery time Ts required for a delivery work of receiving a member necessary for the production of the substrate from member warehouse 95 and conveying the member to at least one of an execution location of the setup work (external setup area 94) and substrate production lines (91, 92, and 93), and determining delivery start timing Ss for starting the delivery work based on setup start timing Sd and delivery time Ts.

According to this, in the same manner as substrate production control system 1 of the embodiment, it is possible to optimize the start timings of the setup work and the delivery work prior to the production start of the substrate.

5. Application and Modification of Embodiment

A hardware configuration of substrate production control system 1 can be variously modified. For example, in a substrate production base including of only one line of first substrate production line 91, progress control section 912 can also serve as each of control function sections of schedule control section 2. Further, setup risk margin time TRd and delivery risk margin time TRs can be used as one risk margin time without being distinguished. Further, the estimation methods of external setup time Td1, internal setup time Td2, and delivery time Ts described in the embodiment are examples, and various other estimation methods can be used. Various other applications and modifications of the present disclosure are possible.

REFERENCE SIGNS LIST

1: substrate production control system, 2: schedule control section, 23: production database, 31: progress detecting section, 32: inventory detecting section, 33: member procurement system, 41: production start timing obtaining section, 42: setup time estimation section, 43: setup start timing determination section, 44: delivery time estimation section, 45: delivery start timing determination section, 46: inventory control section, 47: progress state control section, 48: start timing guide section, 91: first substrate production line, 92: second substrate production line, 93: third substrate production line, 94: external setup area, 95: member warehouse, Sp: production start timing, Sd: setup start timing, Ss: delivery start timing, St: inventory check timing, Td1: external setup time, Td2: internal setup time, TRd: setup risk margin time, Ts: delivery time, TRs: delivery risk margin time

The invention claimed is:

1. A substrate production system comprising:
a substrate production line including a plurality of substrate production machines for producing a substrate, and
processing circuitry configured to:
obtain information from a production database of a production start timing which is a scheduled timing when production of the substrate is started on the substrate production line;
estimate a setup time required for a setup work of setting up the substrate production line so as to produce the substrate based on a predetermined time to load a component reel onto a feeder, a predetermined time of detaching an unnecessary feeder from the substrate production line, and a predetermined time of mounting a needed feeder on the substrate production line, the setup work including an external setup work whose execution location is an external setup area that is external to a production area where the substrate production line is disposed and an internal setup work, executed after the external setup work, whose execution location is the production area;
determine a setup start timing of starting the setup work based on the production start timing and the setup time;
estimate a delivery time required for a delivery work of receiving a member necessary for the production of the substrate from a member warehouse and conveying the member to the external setup area; and
determine a delivery start timing of starting the delivery work based on the setup start timing and the delivery time,
wherein the delivery work is at least one of a batch delivery work in which a member necessary for a predetermined number of the substrates to be produced are collectively received from the member warehouse and a division delivery work in which a member necessary for the setup work and a member necessary with a progress of the production of the substrate are divided and received from the member warehouse.

2. The substrate production system according to claim 1, wherein the processing circuitry is configured to consider a risk margin time corresponding to a risk that a work is prolonged.

3. The substrate production system according to claim 1, wherein the processing circuitry is configured to:
investigate an inventory amount in the member warehouse at an inventory check timing earlier than the delivery start timing, and
instruct procurement of the member in a case where inventory amount of the member is insufficient.

4. The substrate production system according to claim 3, wherein, in a case where a warehousing timing of procurement of the member to the member warehouse is not in time for the delivery start timing, the processing circuitry modifies at least one start timing of the delivery start timing, the setup start timing, and the production start timing, or prompts a production manager to modify the at least one start timing.

5. The substrate production system according to claim 3, wherein, in a case where a warehousing timing of procurement of the member to the member warehouse is not in time for the delivery start timing, the processing circuitry modifies at least one start timing of the delivery start timing and the setup start timing without modifying the production start timing.

6. The substrate production system according to claim 1, wherein the processing circuitry is configured to:
detect a progress state of at least one of the delivery work and the setup work,
predict at least one of an end timing of the delivery work and an end timing of the setup work based on the progress state, and
notify a production manager of a prediction result.

7. The substrate production system according to claim 6, wherein, based on the prediction result, the processing circuitry:
modifies at least one start timing of the setup start timing and the production start timing, or
prompts the production manager to modify the at least one start timing.

8. The substrate production system according to claim 6, wherein, based on the prediction result, the processing circuitry:
modifies at least one plan of a work execution plan of the delivery work and a work execution plan of the setup work, or
prompts the production manager to modify the at least one plan.

9. The substrate production system according to claim 1, wherein the processing circuitry is configured to provide guidance that at least one of the delivery start timing and the setup start timing arrives.

10. The substrate production system according to claim 1, wherein
the estimated setup time includes a setup risk margin time, and
the estimated delivery time includes a delivery risk margin time.

11. The substrate production system according to claim 10, wherein the processing circuitry is configured to:

determine an inventory check timing earlier than the delivery start timing based upon a standard procurement time of the member and a procurement risk margin time;

investigate an inventory amount in the member warehouse at the inventory check timing;

instruct procurement of the member in a case where inventory amount of the member is insufficient; and in a case where a warehousing timing of procurement of the member to the member warehouse is not in time for the delivery start timing, modify at least one start timing of the delivery start timing and the setup start timing without modifying the production start timing.

12. The substrate production system according to claim 1, wherein the processing circuitry is configured to:

determine an inventory check timing earlier than the delivery start timing based upon a standard procurement time of the member and a procurement risk margin time;

investigate an inventory amount in the member warehouse at the inventory check timing;

instruct procurement of the member in a case where inventory amount of the member is insufficient; and in a case where a warehousing timing of procurement of the member to the member warehouse is not in time for the delivery start timing, modify at least one start timing of the delivery start timing and the setup start timing without modifying the production start timing.

13. The substrate production system according to claim 1, wherein the processing circuitry is configured to:

detect a progress state of at least one of the delivery work, the internal setup work, and the external setup work, predict at least one of an end timing of the delivery work, an end timing of the internal setup work, and an end timing of the external setup work based on the progress state, and notify a production manager of a prediction result.

14. The substrate production system according to claim 13, wherein, based on the prediction result, the processing circuitry:

modifies at least one start timing of the setup start timing and the production start timing, or prompts the production manager to modify the at least one start timing.

15. The substrate production system according to claim 13, wherein, based on the prediction result, the processing circuitry:

modifies at least one plan of a work execution plan of the delivery work and a work execution plan of the setup work, or prompts the production manager to modify the at least one plan.

16. A substrate production method comprising:

obtaining information from a production database of a production start timing using processing circuitry, the production start timing being a scheduled timing when production of a substrate is started on a substrate production line including a plurality of substrate production machines for producing the substrate;

estimating, using the processing circuitry, a setup time required for a setup work of setting up the substrate production line so as to produce the substrate based on a predetermined time to load a component reel onto a feeder, a predetermined time of detaching an unnecessary feeder from the substrate production line, and a predetermined time of mounting a needed feeder on the substrate production line, the setup work including an external setup work whose execution location is an external setup area that is external to a production area where the substrate production line is disposed and an internal setup work, executed after the external setup work, whose execution location is the production area;

determining, using the processing circuitry, a setup start timing of starting the setup work based on the production start timing and the setup time;

estimating, using the processing circuitry, a delivery time required for a delivery work of receiving a member necessary for the production of the substrate from a member warehouse and conveying the member to the external setup area; and determining, using the processing circuitry, a delivery start timing of starting the delivery work based on the setup start timing and the delivery time, wherein the delivery work is at least one of a batch delivery work in which a member necessary for a predetermined number of the substrates to be produced are collectively received from the member warehouse and a division delivery work in which a member necessary for the setup work and a member necessary with a progress of the production of the substrate are divided and received from the member warehouse.

17. The substrate production method according to claim 16, further comprising:

producing the substrate via the plurality of substrate production machines.

* * * * *